United States Patent [19]

Rhodes et al.

[11] Patent Number: 5,232,874
[45] Date of Patent: Aug. 3, 1993

[54] METHOD FOR PRODUCING A SEMICONDUCTOR WAFER HAVING SHALLOW AND DEEP BURIED CONTACTS

[75] Inventors: Howard E. Rhodes; Charles H. Dennison, both of Boise, Id.

[73] Assignee: Micron Technology, Inc., Boise, Id.

[21] Appl. No.: 902,679

[22] Filed: Jun. 22, 1992

[51] Int. Cl.⁵ .................. H01L 21/44; H01L 21/48
[52] U.S. Cl. .................. 437/195; 437/41; 437/193; 437/200; 437/228
[58] Field of Search .................. 437/192, 52, 41, 38, 437/195, 200, 193, 228

[56] References Cited

U.S. PATENT DOCUMENTS

| | | | |
|---|---|---|---|
| 4,329,706 | 5/1982 | Crowder et al. | 357/71 |
| 4,966,865 | 10/1990 | Welch et al. | 437/192 |
| 5,017,507 | 5/1991 | Miyazawa | 437/52 |
| 5,057,447 | 10/1991 | Paterson | 437/43 |
| 5,194,404 | 3/1993 | Nagatouro | 437/200 |

FOREIGN PATENT DOCUMENTS 2148593A 5/1985 United Kingdom .

Primary Examiner—Olik Chaudhuri
Assistant Examiner—H. Jey Tsai
Attorney, Agent, or Firm—Wells, St. John, Roberts, Gregory & Matkin

[57] ABSTRACT

This invention relates to a semiconductor processing method for producing a semiconductor wafer having shallow buried contacts in a first region of the wafer and deep buried contacts in a second region of the wafer. The method, in it preferred form, includes: (a) defining first and second active areas of a substrate in the respective first and second regions; (b) providing first conductive runners over the wafer in the first and second regions; (c) providing both second conductive runners and conductive etch stop platforms in the second region from a single second conductive layer, wherein the etch stop platforms electrically contact corresponding second active areas in the second region; (d) providing an insulative layer over the wafer with an upper surface which is elevationally higher relative to the second active areas in the second region as compared to the first active areas in the first region; (e) patterning and etching the insulative layer to provide first contact openings which extend to the first active areas in the first region of the substrate, and second contact openings which extend to the conductive etch stop platforms provided above the second active areas in the second region; and (f) providing a third conductive layer over the insulative layer and into the first and second contact openings to electrically contact the first active areas in the first region and the etch stop layer in the second region.

16 Claims, 8 Drawing Sheets

METHOD FOR PRODUCING A SEMICONDUCTOR WAFER HAVING SHALLOW AND DEEP BURIED CONTACTS

TECHNICAL FIELD

This invention relates to semiconducting processing methods for producing a semiconductor wafer having both shallow and deep buried contacts.

BACKGROUND OF THE INVENTION

Wafer topography often varies significantly from region to region of a semiconductor wafer due to the underlying structure of different height semiconductor components. In an effort to reduce the size of semiconductor devices and thereby improve packing density, it is often necessary to stack one portion of a component on top of another. In those regions of the semiconductor wafer having stacked multi-level components (such as stacked digit lines, stacked capacitors, etc.), an upper surface of a covering insulating layer is elevationally high relative to the substrate. On the other hand, in those regions of the semiconductor wafer in which single level components are constructed, the upper surface of the insulating layer is elevationally low relative to the substrate.

A section of a semiconductor wafer having a varying topography is illustrated in FIG. 1, which shows a semiconductor wafer segment 10 having a first region 12 and a second region 14. Wafer 10 comprises a bulk substrate 16, field oxide 18, and first and second active areas 20, 21 formed between field oxide 18. A p-type impurity is implanted into substrate 16 in first active area 20 of first region 12 to form p region 15. An n-type impurity is implanted into substrate 16 in second active area 21 of second region 14 to for n+ region 17. First conductive runners 22, 24, 26, and 28 are provided on top of field oxide 18 in both first region 12 and second region 14. Second conductive runners 30 and 32 are provided on top of first conductive runners 26 and 28 in second region 14.

An insulative layer 34 having an upper surface 36 is deposited over wafer 10 to cover and protect the semiconductor device. In first region 12, upper surface 36 of insulative layer 34 is at an elevational height "A" relative to substrate 16. A buried contact opening formed in insulative layer 34 at this location is considered to be a comparatively "shallow" contact opening because the insulative layer is relatively thin in first region 12.

In comparison, upper surface 36 of insulative layer 34 is at an elevational height "B" above substrate 16 in second region 14 which is greater than elevational height "A". Upper surface 36 is higher in second region 14 (i.e., height "B") as compared to first region 12 (i.e., height "A") because of the stacked runner structure formed in second region 14. A buried contact opening formed in insulative layer 34 in second region 14 is considered to be a comparatively "deep" contact opening because the insulative layer is relatively thick in this second region.

One example of where this varying topography occurs is in buried digit-line stacked DRAM chips. The stacked conductive runners in second region 14 represent the stacked digit-line structure found in sense amplifiers formed adjacent to, but outside of, a memory array. First region 12 represents other pitched cells which are farther removed from the memory array. In some present stacked DRAM chips, deep buried contacts may have a height "B" equal to approximately two microns, while shallow buried contacts may have a height "A" of approximately one micron or less. This discrepancy between deep and shallow buried contacts on the same wafer introduces significant problems which are illustrated and discussed below with reference to FIGS. 2-5.

In FIG. 2, mask and etching steps were performed on the FIG. 1 wafer to form contact openings 40 and 42. Contact opening 40 has sufficient depth to reach substrate 16 in first active area 20. However, contact opening 42 is "under etched" and does not reach substrate 16 in second active area 21. This "under etch" would result in a defective semiconductor device.

To compensate for this problem, manufacturers are inclined to etch to a greater depth in an effort to insure that contact opening 42 reaches substrate 16. Accordingly, in FIG. 3, an etch is conducted to the FIG. 1 wafer to form contact openings 44 and 46. While contact opening 46 now properly extends to substrate 16 in second active area 21, contact opening 44 can be "over etched" through p region 15 in first active area 20. This "over etch" would also result in a defective semiconductor device.

A separate problem associated with forming buried contact openings is that of misalignment. As shown in FIG. 4, contact opening 48 is misaligned over active area 21 in second region 14. As a result of this misalignment, contact opening 48 is etched into field oxide 18 and through n+ region 17 into substrate 16. Similarly, contact opening 47 is misaligned and etched into field oxide 18 and through p region 15 into substrate 16.

In prior art processes, such misalignment is remedied by one of three solutions illustrated in FIGS. 5A-5C which all include an additional n-type implant processing step. As shown in FIG. 5A, a mask 50 is provided atop insulative layer 34 and patterned to expose contact opening 48 in second region 14. A heavy dose of n-type impurity, typically phosphorous, is implanted through contact opening 48 into substrate 16 to form secondary n+ region 52. Mask 50 prevents the n-type impurity from being implanted through contact opening 47 into p region 15 in first region 12.

A second, more complete, solution is to first mask the p contact regions and perform an n-type implant into the n+ contact regions (as illustrated in FIG. 5A) and then to apply a second mask over the n+ contact regions and perform a p-type implant into the p contact regions as illustrated in FIG. 5B. After first mask 50 is removed, a second mask 51 is provided atop insulative layer 34 and patterned to expose contact opening 47 in first region 12. A p-type impurity, typically boron, is implanted through contact opening 47 into substrate 16 to form secondary p region 53. Mask 51 prevents the p-type impurity from being implanted through contact opening 48 into n+ region 17 in second region 14.

A third solution is to provide a blanket n-type impurity implant across the entire semiconductor wafer as shown in FIG. 5C. The n-type impurity has a lower concentration than that used above with respect to the implant shown in FIG. 5A. This blanket n-type impurity implant forms secondary n region 52 in contact opening 48 of second region 14 as well as slightly degrading p region 15 in first region 12. This prior art solution provides a less-effective plug implant 52 in second region 14, but has the advantage of eliminating additional mask steps that are necessary in the previous solutions.

The present invention defines a process which simultaneously obviates problems associated with varying contact depth and misalignment.

BRIEF DESCRIPTION OF THE DRAWINGS

One or more of the preferred embodiments of the invention are illustrated in the following accompanying drawings.

FIG. 2 shows problems associated with "under etching".

FIG. 3 shows problems associated with "over etching".

FIG. 4 shows problems associated with misalignment.

DETAILED DESCRIPTION OF THE PREFERRED EMBODIMENTS

Figure 1:
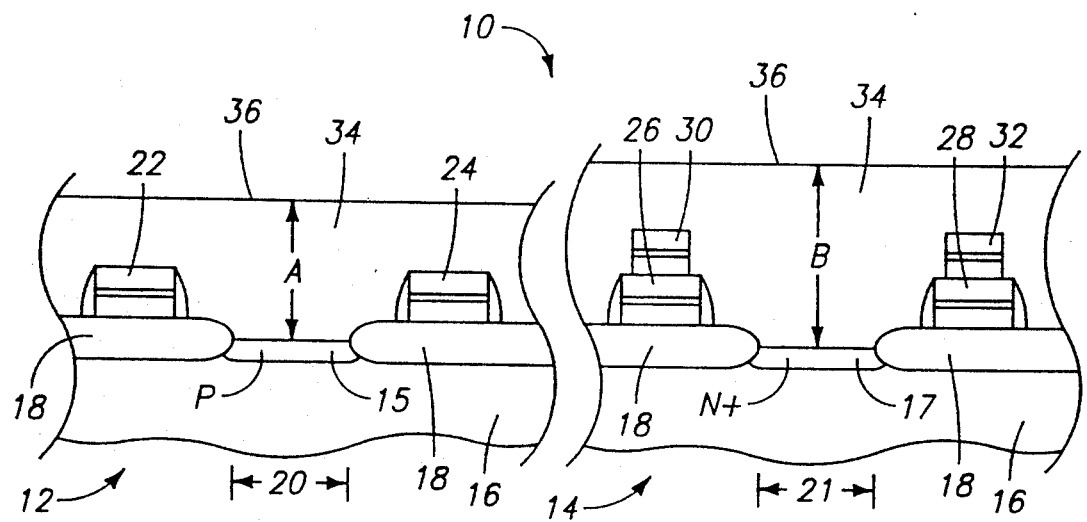
FIG. 1 is a diagrammatic section of a semiconductor wafer having both shallow and deep buried contacts shown at one processing step in accordance with prior art processes.
Figure 2:
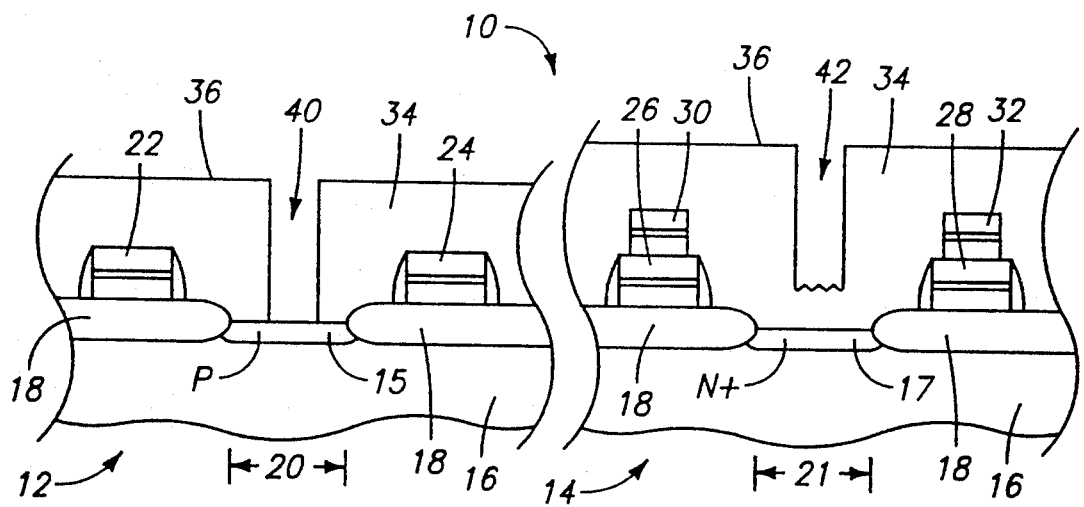
FIG. 2 is a diagrammatic section of the FIG. 1 wafer illustrated at a prior art processing step subsequent to that shown in FIG. 1.
Figure 3:
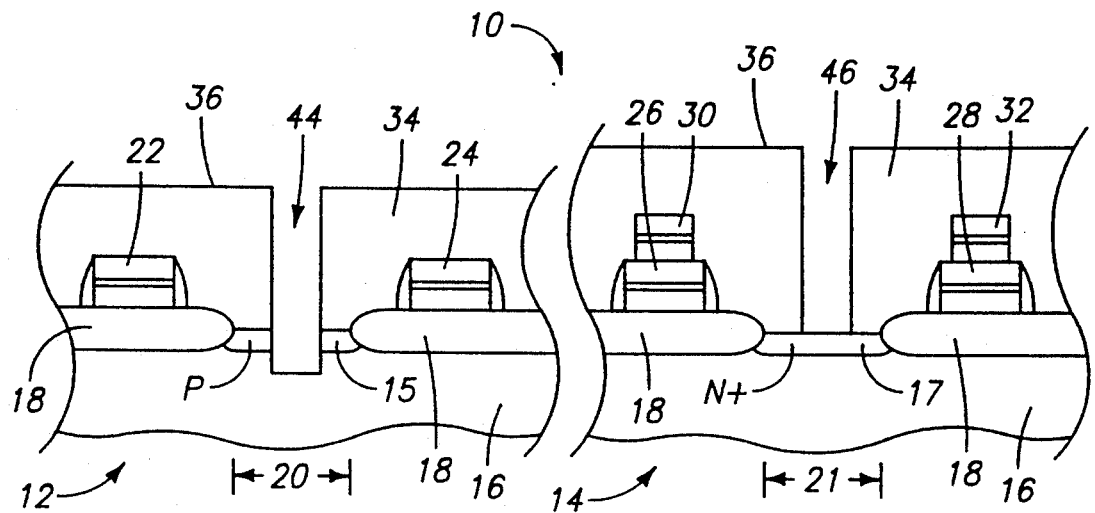
FIG. 3 is a diagrammatic section of the FIG. 1 wafer illustrated at a prior art processing step subsequent to that shown in FIG. 1.
Figure 4:
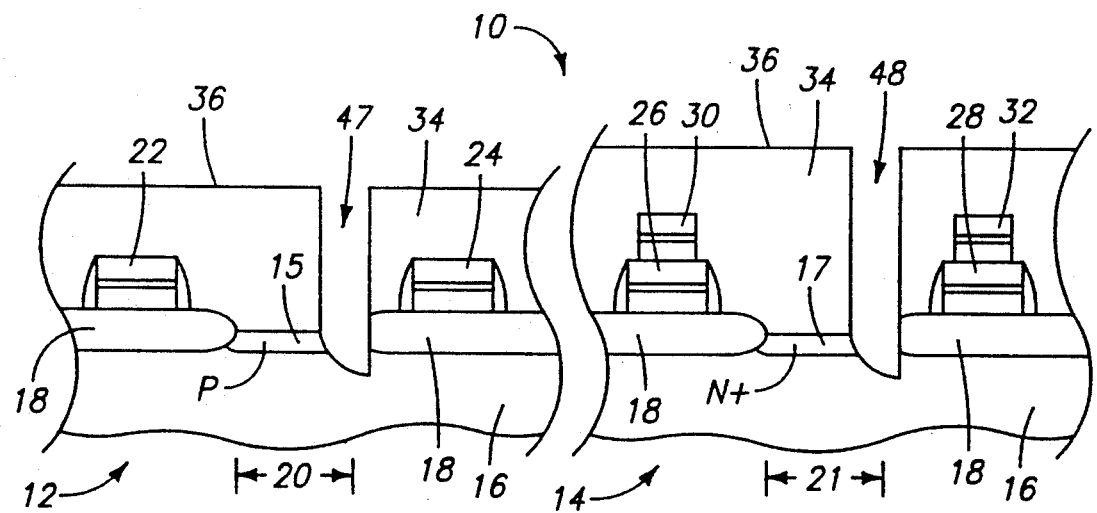
FIG. 4 is a diagrammatic section of the FIG. 1 wafer illustrated at a prior art processing step subsequent to that shown in FIG. 1.
Figure 5A:
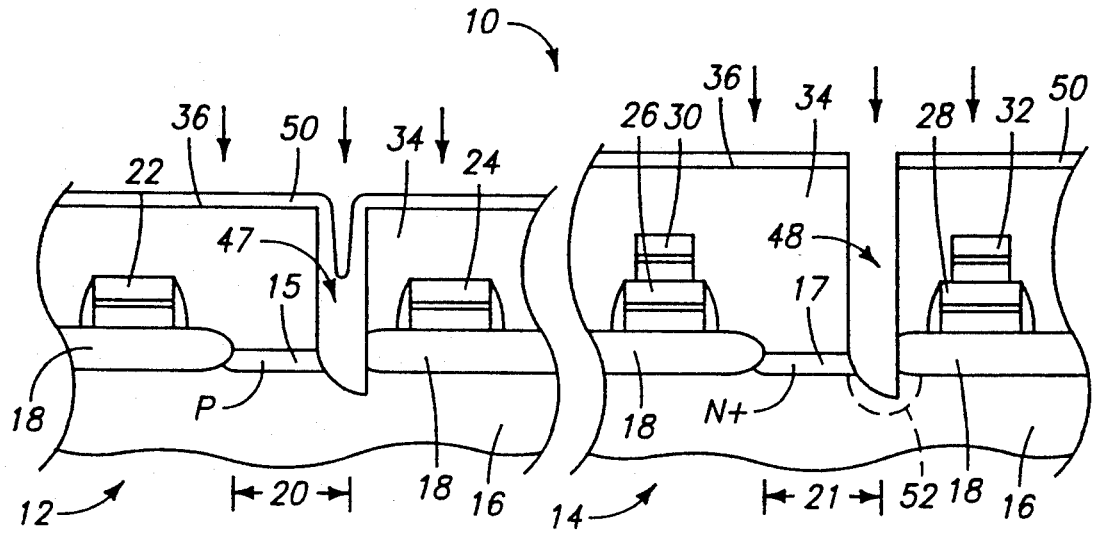
FIG. 5A is a diagrammatic section of the FIG. 1 wafer illustrated at a prior art processing step subsequent to that shown in FIG. 4.
Figure 5B:
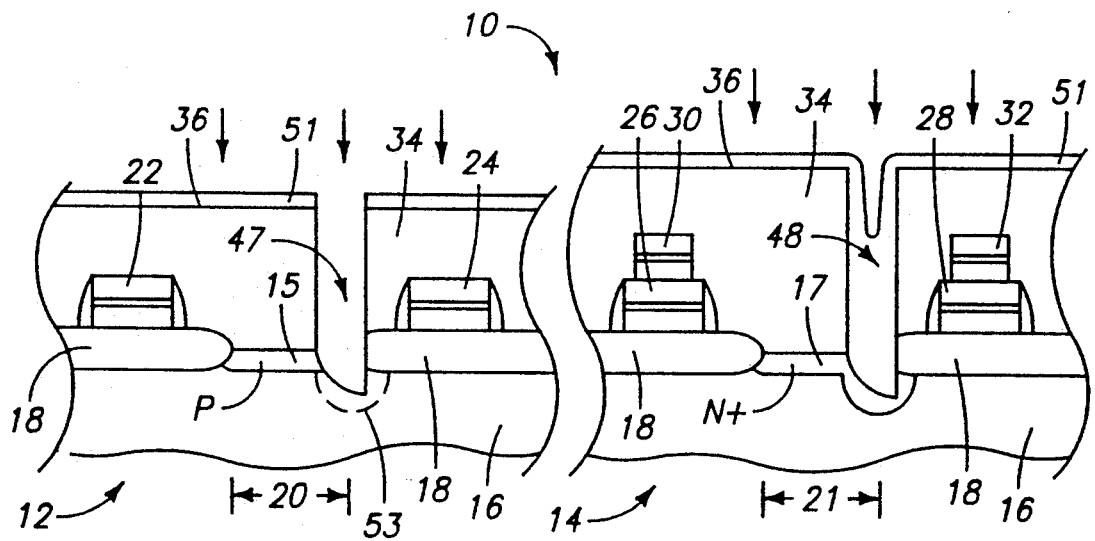
FIG. 5B is a diagrammatic section of the FIG. 1 wafer illustrated at a prior art processing step subsequent to that shown in FIG. 5A.
Figure 5C:
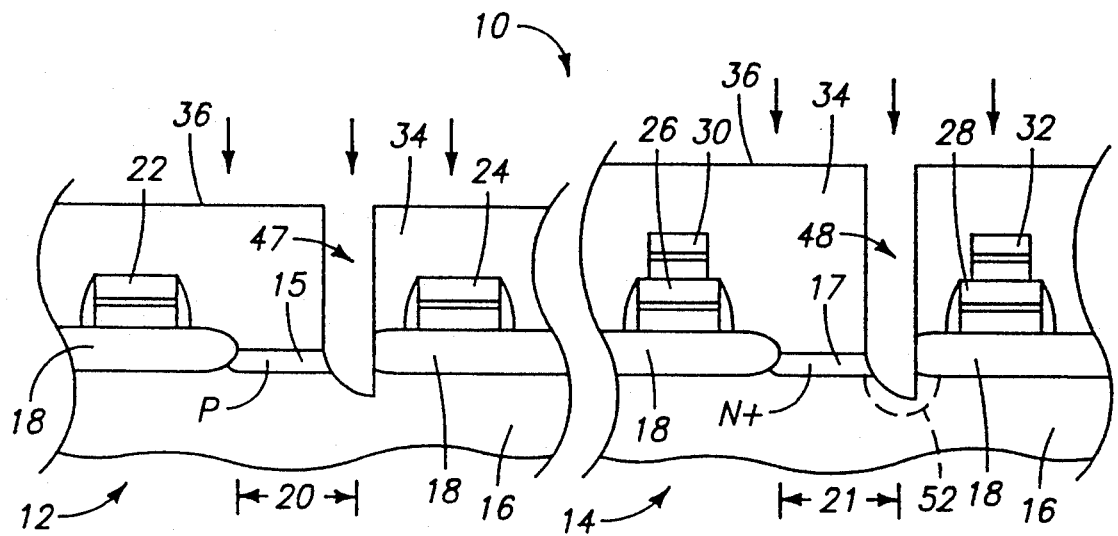
FIG. 5C is a diagrammatic section of the FIG. 1 wafer illustrated at a prior art processing step subsequent to that shown in FIG. 4.

This disclosure of the invention is submitted in furtherance of the constitutional purposes of the U.S. Patent Laws "to promote the progress of science and useful arts" (Article 1, Section 8).

According to one aspect of this invention, a semiconductor processing method for producing a semiconductor wafer having shallow buried contacts in a first region of the wafer and deep buried contacts in a second region of the wafer comprises the steps of:

defining first and second active areas of a substrate in respective first and second regions of a semiconductor wafer;

providing a first conductive layer over the wafer;

patterning and etching the first conductive layer to form first conductive runners in the first and second regions;

providing a second conductive layer over the wafer;

patterning and etching the second conductive layer to form both (a) second conductive runners and (b) conductive etch stop platforms in the second region, the etch stop platforms electrically contacting corresponding second active areas in the second region;

providing an insulative layer over the wafer, the insulative layer having an upper surface which is elevationally higher relative to the second active areas in the second region as compared to the first active areas in the first region;

patterning and etching the insulative layer to provide (a) first contact openings which extend to the first active areas in the first region, and (b) second contact openings which extend to the conductive etch stop platforms provided above the second active areas in the second region; and providing a third conductive layer over the insulative layer and into the first and second contact openings, the third conductive layer electrically contacting the first active areas in the first region and electrically contacting the etch stop layer in the second region.

In accordance with another aspect of the invention, a semiconductor processing method comprises the steps of:

defining first and second active areas of a substrate in respective first and second regions of a semiconductor wafer;

providing a first conductive layer over the wafer;

patterning and etching the first conductive layer to form first conductive runners in the first and second regions;

providing a polysilicon layer over the wafer;

providing a silicide layer atop the polysilicon layer;

providing a first oxide layer over the silicide layer;

patterning and etching the first oxide layer, the silicide layer, and the polysilicon layer to form both (a) second conductive runners and (b) conductive etch stop platforms in the second region, the polysilicon layer of the etch stop platforms electrically contacting corresponding second active areas in the second region;

providing a second oxide layer over the wafer, the second oxide layer having an upper surface which is elevationally higher relative to the second active areas in the second region as compared to the first active areas in the first region;

patterning and etching (a) the second oxide layer to provide first contact openings which extend to the first active areas in the first region, and (b) the first and second oxide layers to provide second contact openings which extend at least to the silicide layer of the etch stop platforms provided above the second active areas in the second region; and providing a top conductive layer over the second oxide layer and into the first and second contact openings, the top conductive layer electrically contacting the first active areas in the first region and electrically contacting the silicide layer of the etch stop platforms in the second region.

A semiconducting processing method for producing a semiconductor wafer having shallow buried contacts in a first region of the wafer and deep buried contacts in a second region of the wafer is described with reference to FIGS. 6-12. The same numbers have been used throughout these figures to reference like parts.

Figure 6:
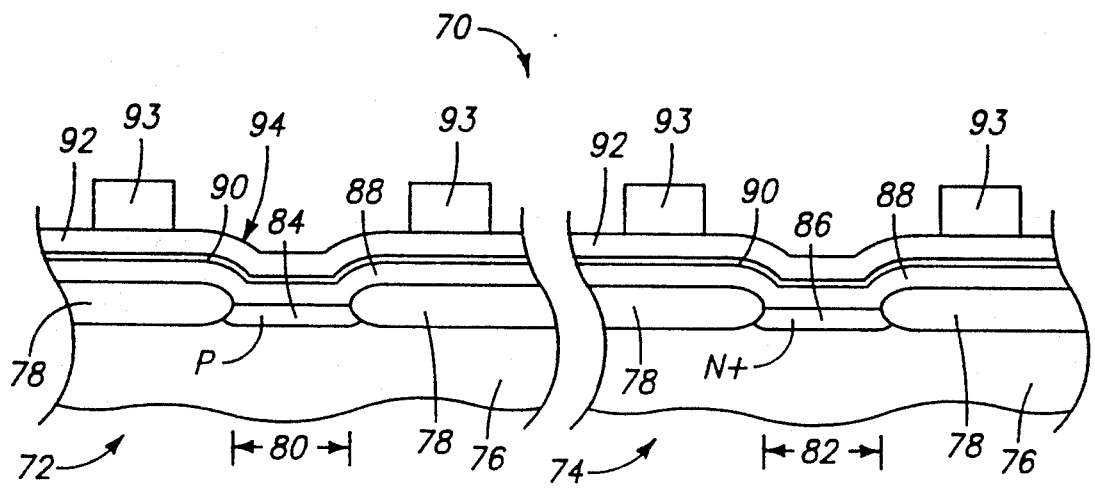
FIG. 6 is a diagrammatic section of a semiconductor wafer shown at one processing step in accordance with the invention.

FIG. 6 shows a section of a semiconductor wafer 70 having a first region 72 and a second region 74. In the preferred embodiment, second region 74 represents a section of the semiconductor wafer with the peripheral or pitched cells located near, but outside, a memory array in which "deep" contact openings are to be formed. First region 72 represents a section of the semiconductor wafer with pitched cells located farther away from the memory array in which "shallow" contact openings are to be formed. Wafer 70 includes a substrate 76, field oxide 78, a first active area 80 in first region 72, and a second active area 82 in second region 74. Active areas 80 and 82 are positioned between field oxide 78. In first region 72, a p-type impurity is implanted in first active area 80 to define p region 84. In second region 74, an n-type impurity is implanted into active area 82 to define an n+ region 86. Preferably, only n+ regions are formed in second region 74.

A first polysilicon layer 88 is provided over wafer 70. A first silicide layer 90 is then provided over first polysilicon layer 88. First silicide layer 90 is preferably formed of tungsten silicide (WSi$_x$, x=1.5 to 3.0). Next, a first oxide layer 92 is deposited over first silicide layer 90. For purposes of the continuing discussion, first polysilicon layer 88, first silicide layer 90, and first oxide layer 92 in combination constitute a first conductive layer 94.

Figure 7:
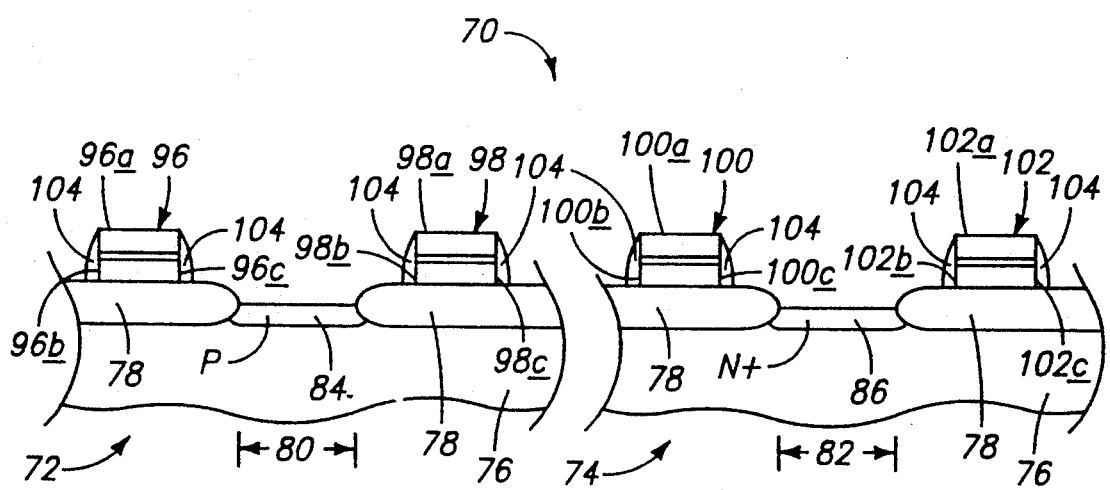
FIG. 7 is a diagrammatic section of the FIG. 6 wafer illustrated at a processing step subsequent to that shown in FIG. 6.

First conductive layer 94 is then masked by first mask 93 (FIG. 6) and etched to remove oxide, silicide, and polysilicon to define first conductive runners 96, 98, 100, and 102 in first and second regions 72 and 74 (FIG. 7). Individual first conductive runners 96, 98, 100, and 102 have respective tops 96a, 98a, 100a, and 102a and respective sides 96b/96c, 98b/98c, 100b/100c, and 102b/102c. An insulative layer is then deposited, patterned, and etched to form insulative spacers 104 on the sides of first conductive runners 96, 98, 100, and 102.

Figure 8:
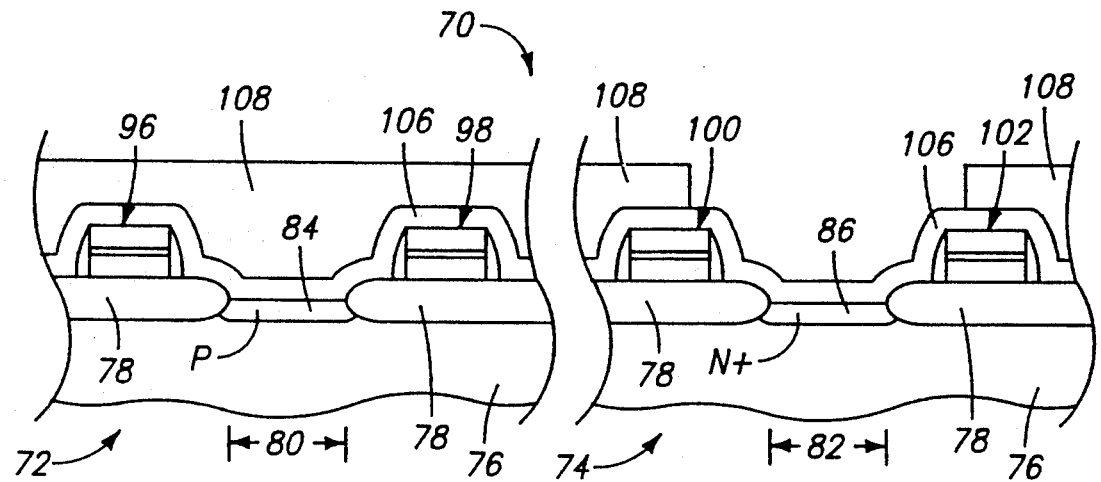
FIG. 8 is a diagrammatic section of the FIG. 6 wafer illustrated at a processing step subsequent to that shown in FIG. 7.

In FIG. 8, another insulative layer 106, which is preferably TEOS, is deposited over the semiconductor wafer 70. TEOS layer 106 is masked by second mask 108 in second region 74 and etched to expose second active area 82 between adjacent first conductive runners 100 and 102. The patterned and etched TEOS layer 106 is used to define buried contact openings in the memory array (not shown). Mask 108 preferably covers the entire first region 72.

Figure 9:
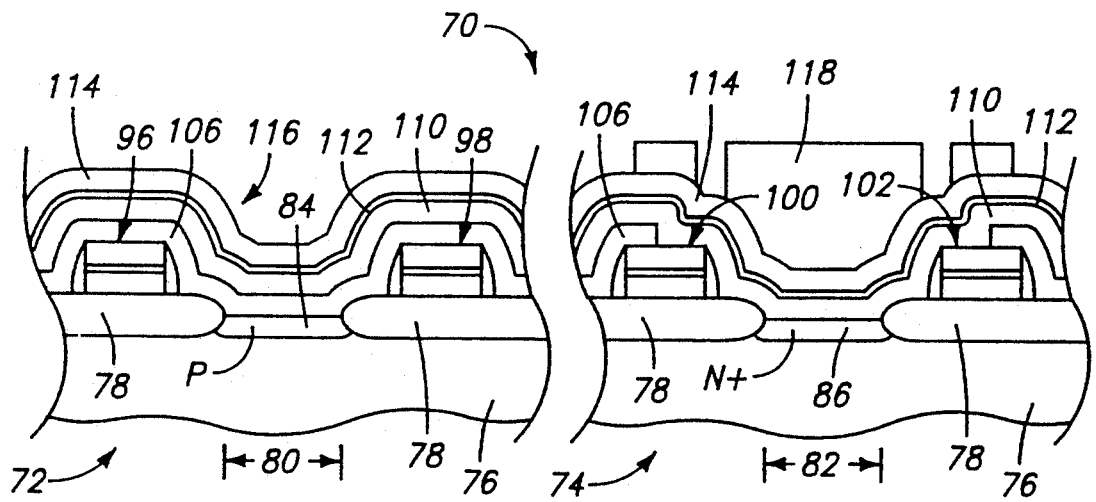
FIG. 9 is a diagrammatic section of the FIG. 6 wafer illustrated at a processing step subsequent to that shown in FIG. 8.

In FIG. 9, a second polysilicon layer 110 is provided over wafer 70. This polysilicon layer is preferably doped (via diffusion or implant) with an n-type impurity such as phosphorous, antimony, and arsenic. A second silicide layer 112 is then provided over second polysilicon layer 110. Preferably, second silicide layer 112 is formed of tungsten silicide (WSi$_x$, x=1.5 to 3.0). Thereafter, a second oxide layer 114 is deposited over second silicide layer 112. Second oxide layer 114 is preferably an undoped oxide. Second polysilicon layer 110, second silicide layer 112, and second oxide layer 114 in combination can be considered as constituting or defining a second conductive layer 116.

Figure 10:
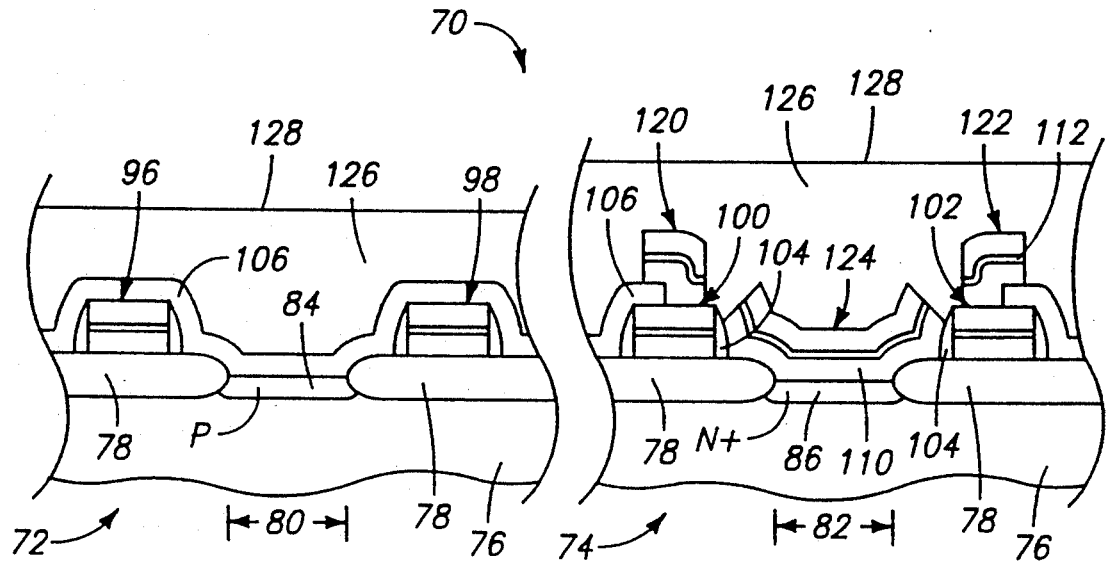
FIG. 10 is a diagrammatic section of the FIG. 6 wafer illustrated at a processing step subsequent to that shown in FIG. 9.

Second conductive layer 116 is then masked by third mask 118 in second region 74 (FIG. 9) and etched to remove oxide, silicide, and polysilicon to define second conductive runners 120, 122 and etch stop platform 124 in second region 74 (FIG. 10). First conductive runners 100 and 102 and corresponding second conductive runners 120 and 122 form, in the preferred embodiment, a stacked digit line employed in sense amplifiers near the memory array. Second conductive layer 116 is entirely removed from first region 72 so that no second conductive runners are formed in this region.

Second polysilicon layer 110 of conductive etch stop platform 124 electrically contacts active area 82, or more particularly, the n+ region 86 of substrate 76 within active area 82 of second region 74. Etch stop platform 124 preferably extends across active area 82 and onto field oxide 78 and insulative spacers 104. One advantage of this invention is that no special or additional processing steps are required to form etch stop platform 124 because this platform is formed simultaneously with second conductive runners 120 and 122 from second conductive layer 116.

After second conductive layer 116 has been patterned and etched to form second conductive runners 120 and 122 and etch stop platform 124, a planarized insulative layer 126 is provided over wafer 70. Preferably, insulative layer 126 is a doped oxide such as BPSG. Insulative layer 126 has an upper surface 128 which is elevationally higher relative to second active area 82 in second region 74 as compared to first active area 80 in first region 76. The increased surface height in second region 74 is caused by the underlying stacked digit-line structure formed by first conductive runners 100 and 102 and corresponding second conductive runners 120, 122.

Figure 11:
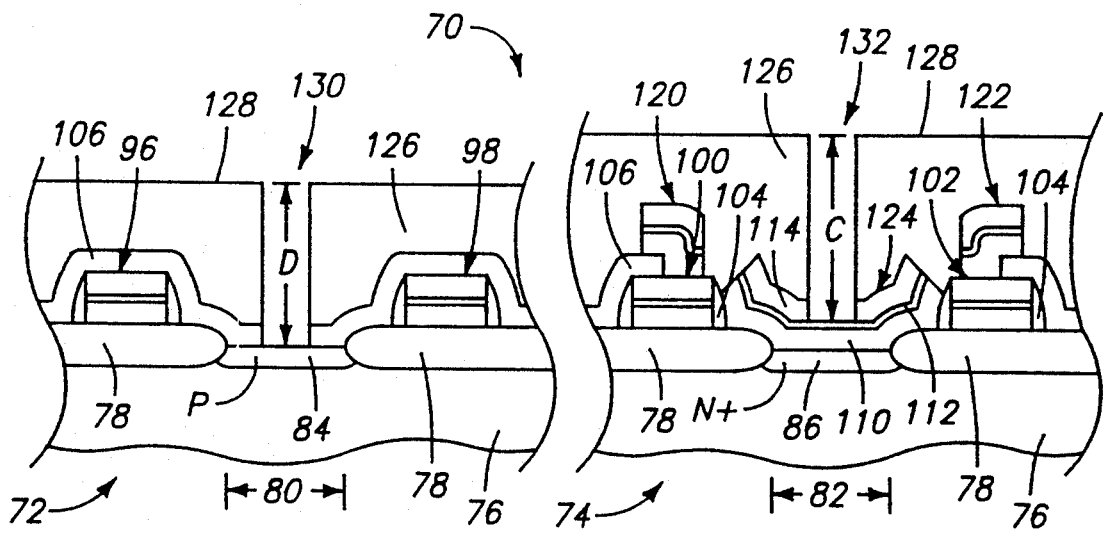
FIG. 11 is a diagrammatic section of the FIG. 6 wafer illustrated at a processing step subsequent to that shown in FIG. 10.

In FIG. 11, insulative layer 126 is patterned and etched to form a "shallow" first contact opening 130 and a "deep" second contact opening 132. First contact opening 130 extends to first active area 80 of first region 72 and has a depth "D". Second contact opening 132 extends to etch stop platform 124 provided above second active area 82 in second region 74 and has a depth "C". More specifically, second contact opening 132 extends at least to second silicide layer 112 of etch stop platform 124. Second contact opening 132 may also, in another embodiment, extend through second silicide layer 112 to second polysilicon layer 110 of etch stop platform 124. Preferably, insulative or BPSG layer 126 is subjected to a dry etch which is selective relative to silicide. It is also preferred that BPSG layer 126 and the undoped second oxide layer 114 of etch stop platform 124 be etched at approximately the same rate when forming second contact opening 132.

Due to etch stop platform 124 above second active area 82, depth "C" of second contact opening 132 is significantly less than the elevational height of upper surface 128 of insulative layer 126 relative to second active area 82 (i.e., height "B" of the original buried contact opening shown in Prior Art FIG. 1). Additionally, there is less discrepancy between second contact opening depth "C" and first contact opening depth "D". An etch selective to etch stop platform 124 may therefore be employed to form first and second contact openings 130 and 132 to proper depths, thereby reducing or eliminating the problems associated with "over etch" and "under etch".

According to an aspect of this invention, wafer 70 is subjected to a blanket p-type implant after first and second contact openings 130 and 132 are formed. This p-type implant enhances p region 84 in the case where opening 130 is slightly over etched or misaligned. Second silicide layer 112 and second polysilicon layer 110 protect n+ region 86 from being implanted with the p-type dopant. Additionally, to enhance the integrity of n+ region 86, the n-type dopant (i.e., phosphorous, antimony, or arsenic) in second polysilicon layer 110 out diffuses into n+ region 86. Unlike prior art processes, no additional masks are required in these steps, making this invention advantageous over prior art processes.

Figure 12:
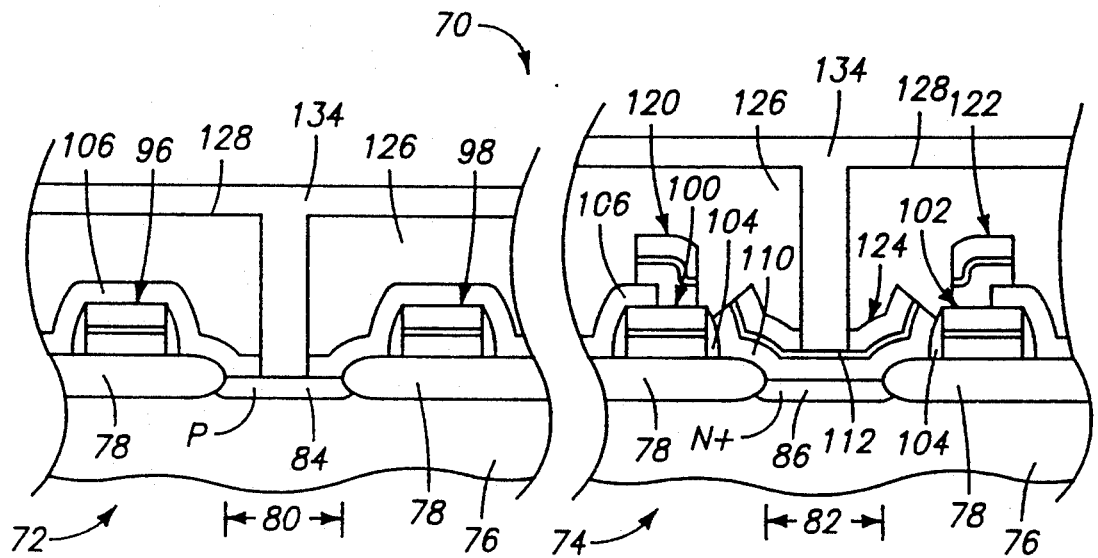
FIG. 12 is a diagrammatic section of the FIG. 6 wafer illustrated at a processing step subsequent to that shown in FIG. 11.

In FIG. 12, a top or third conductive layer 134 is provided over insulative layer 126 and into first and second contact openings 130 and 132. Layer 134 electrically contacts first active area 80 (or more particularly, p region 84) in first region 72. Third conductive layer 134 also electrically contacts second silicide layer 112 of etch stop platform 124 in second region 74.

Accordingly, the present invention provides an effective method of forming contact openings in a semiconductor wafer having shallow and deep contact regions. By forming an etch stop platform above active areas in deep buried contact regions, all buried contact openings have a more uniform depth across the wafer. Moreover, this method does not require any additional processing steps because the etch stop platform is formed using a second conductive layer which is already being deposited to form digit lines or the like in other areas of the wafer.

Figure 13:
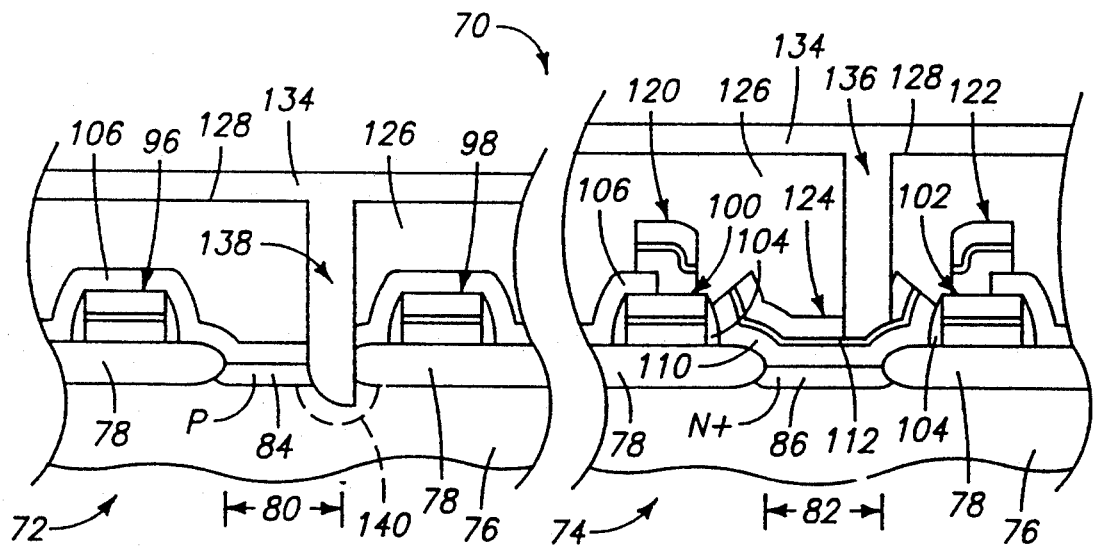
FIG. 13 is a diagrammatic section of the FIG. 6 wafer at a processing step subsequent to FIG. 10 and is used to illustrate the advantage of the invention in reducing problems associated with misalignment.

This invention also has an advantage of misalignment tolerance. In FIG. 13, insulative layer 126 is patterned and etched to form misaligned contact opening 136 in second region 74 and misaligned contact opening 138 in first region 72. With respect to the "deep" contact region 74, contact opening 136 extends to second silicide layer 112 of etch stop platform 124 because the dry etchant is selective to silicide. Therefore, despite the misaligned contact opening 136, third conductive layer 134 is still in electrical contact with n+ region 86 of second active area 82 through second polysilicon layer 110 and second silicide layer 112.

With respect to the "shallow" contact region 72, the wafer can be subjected to a p-type implant prior to depositing third conductive layer 134 to define secondary p region 140. Second silicide layer 112 of etch stop platform 124 protects n+ region 86 during this implant. Thus, the misalignment of contact opening 133 in region 72 is easily remedied through this additional implant step.

The semiconductor process according to this invention is therefore advantageous because it provides significant misalignment tolerance. This invention also eliminates one or two additional masking steps which were used in prior art processes to add the secondary doped regions beneath misaligned contact openings.

This invention has been described as having all n-type contacts positioned in the "deep" contact region 74 and all p-type contacts positioned in the "shallow" contact region 72. However, the semiconductor wafer can be processed such that all n-type contacts are disposed in the "shallow" contact region 72 and all p-type contacts are disposed in the "deep" contact region 74. In this latter construction, second polysilicon layer 110 would be doped with a p-type impurity, such as boron, to remain compatible with the underlying p-type region in "deep" contact region 74 for purposes of out diffusion from layer 110.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method for producing a semiconductor wafer having shallow buried contacts in a first region of the wafer and deep buried contacts in a second region of the wafer, comprising the steps of:
    defining first and second active areas of a substrate in respective first and second regions of a semiconductor wafer;
    initially doping the first active areas of the substrate in the first region with an impurity of a first conductivity type;
    providing a first conductive layer over the wafer;
    patterning and etching the first conductive layer to form first conductive runners in the first and second regions;
    providing a second conductive layer over the wafer;
    patterning and etching the second conductive layer to form both (a) second conductive runners and (b) conductive etch stop platforms in the second region, the etch stop platforms electrically contacting corresponding second active areas in the second region;
    providing an insulative layer over the wafer, the insulative layer having an upper surface which is elevationally higher relative to the second active areas in the second region as compared to the first active areas in the first region;
    patterning and etching the insulative layer to provide (a) first contact openings which extend to the first active areas of the substrate in the first region, and (b) second contact openings which extend to the conductive etch stop platforms provided above the second active areas in the second region;
    subjecting the wafer to an implant of the first conductivity type impurity after the insulative layer has been patterned and etched to form the first and second openings, the etch stop platforms protecting the second active areas from the implant of the first conductivity type impurity; and
    providing a third conductive layer over the insulative layer and into the first and second contact openings, the third conductive layer electrically contacting the first active areas in the first region and electrically contacting the etch stop layer in the second region.

2. A semiconductor processing method according to claim 1 wherein the step of providing a second conductive layer comprises:
    providing a polysilicon layer over the wafer;
    providing a silicide layer atop the polysilicon layer; and
    providing an oxide layer over the silicide layer.

3. A semiconductor processing method according to claim 1 wherein the step of providing a second conductive layer comprises:
    providing a polysilicon layer over the wafer;
    providing a silicide layer atop the polysilicon layer; and providing an oxide layer over the silicide layer; the method further comprising:

etching through the insulative layer and the oxide layer using a dry etchant and stopping at one of the silicide layer or the polysilicon layer.

4. A semiconductor processing method according to claim 1 further comprising doping the second active areas in the second region with an n-type impurity.

5. A semiconductor processing method according to claim 1 wherein the step of providing a first conductive layer comprises:

providing a first polysilicon layer over the wafer;

providing a first silicide layer over the polysilicon layer; and providing a first oxide layer over the silicide layer; the step of providing a second conductive layer comprises:

providing a second polysilicon layer over the wafer;

providing a second silicide layer over the polysilicon layer; and providing a second oxide layer over the silicide layer.

6. A semiconductor processing method according to claim 1 wherein individual first conductive runners have sides, the method further comprising:

forming insulative spacers on the sides of the first conductive runners;

patterning and etching the second conductive layer to form conductive etch stop platforms above the second active areas in the second region and extending onto the insulative spacers.

7. A semiconductor processing method according to claim 1 wherein:

the insulative layer is formed of doped oxide; and the step of providing a second conductive layer comprises:

providing a polysilicon layer over the wafer;

providing a silicide layer over the polysilicon layer; and providing an undoped oxide layer over the silicide layer.

8. A semiconductor processing method according to claim 7 further comprising etching the doped oxide layer and the undoped oxide layer at approximately the same etch rate.

9. A semiconductor processing method for producing a semiconductor wafer having shallow buried contacts in a first region of the wafer and deep buried contacts in a second region of the wafer, comprising the steps of:

defining first and second active areas of a substrate in respective first and second regions of a semiconductor wafer;

initially doping the first active areas of the substrate in the first region with an impurity of a first conductivity type;

providing a first conductive layer over the wafer;

patterning and etching the first conductive layer to form first conductive runners in the first and second regions;

providing a polysilicon layer over the wafer;

providing a silicide layer atop the polysilicon layer;

providing a first oxide layer over the silicide layer;

patterning and etching the first oxide layer, the silicide layer, and the polysilicon layer to form both (a) second conductive runners and (b) conductive etch stop platforms in the second region, the polysilicon layer of the etch stop platforms electrically contacting corresponding second active areas in the second region;

providing a second oxide layer over the wafer, the second oxide layer having an upper surface which is elevationally higher relative to the second active areas in the second region as compared to the first active areas in the first region;

patterning and etching (a) the second oxide layer to provide first contact openings which extend to the first active areas in the first region, and (b) the first and second oxide layers to provide second contact openings which extend at least to the silicide layer of the etch stop platforms provided above the second active areas in the second region;

subjecting the wafer to an implant of the first conductivity type impurity after the insulative layer has been patterned and etched to form the first and second openings, the etch stop platforms protecting the second active areas from the implant of the first conductivity type impurity; and providing a top conductive layer over the second oxide layer and into the first and second contact openings, the top conductive layer electrically contacting the first active areas in the first region and electrically contacting the silicide layer of the etch stop platforms in the second region.

10. A semiconductor processing method according to claim 9 further comprising:

initially doping the first active areas in the first regions with a p-type impurity;

initially doping the second active areas in the second regions with an n-type impurity; and doping the polysilicon layer with the n-type impurity.

11. A semiconductor processing method according to claim 10 further comprising out diffusing the n-type impurity from the polysilicon layer into the second active areas.

12. A semiconductor processing method according to claim 9 further comprising:

initially doping the first active areas in the first regions with an n-type impurity;

initially doping the second active areas in the second regions with a p-type impurity; and doping the polysilicon layer with the p-type impurity.

13. A semiconductor processing method according to claim 12 further comprising out diffusing the p-type impurity from the polysilicon layer into the second active areas.

14. A semiconductor processing method according to claim 9 wherein individual first conductive runners have sides, the method further comprising:

forming insulative spacers on the sides of the first conductive runners;

patterning and etching the first oxide layer, the silicide layer, and the polysilicon layer to form conductive etch stop platforms above the second active areas in the second region and extending onto the insulative spacers.

15. A semiconductor processing method according to claim 9 wherein the first oxide layer is undoped and the second oxide layer is doped, further comprising etching the doped second oxide layer and the undoped first oxide layer at approximately the same etch rate.

16. A semiconductor processing method for producing a semiconductor wafer having shallow buried contacts in a first region of the wafer and deep buried contacts in a second region of the wafer, comprising the steps of:

defining first and second active areas of a substrate in respective first and second regions of a semiconductor wafer;

providing a first conductive layer over the wafer;

patterning and etching the first conductive layer to form first conductive runners in the first and second regions;

providing a polysilicon layer over the wafer;

providing a silicide layer atop the polysilicon layer;

providing an undoped first oxide layer over the silicide layer;

patterning and etching the first oxide layer, the silicide layer, and the polysilicon layer to form both (a) second conductive runners and (b) conductive etch stop platforms in the second region, the polysilicon layer of the etch stop platforms electrically contacting corresponding second active areas in the second region;

providing a doped second oxide layer over the wafer, the second oxide layer having an upper surface which is elevationally higher relative to the second active areas in the second region as compared to the first active areas in the first region;

patterning and etching (a) the doped second oxide layer to provide first contact openings which extend to the first active areas in the first region, and (b) the undoped first oxide layer and the doped second oxide layer to provide second contact openings which extend at least to the silicide layer of the etch stop platforms provided above the second active areas in the second region, the doped second oxide layer and the undoped first oxide layer being etched at approximately the same etch rate; and providing a top conductive layer over the second oxide layer and into the first and second contact openings, the top conductive layer electrically contacting the first active areas in the first region and electrically contacting the silicide layer of the etch stop platforms in the second region.

* * * * *